United States Patent [19]
Cloutier

[11] Patent Number: 6,057,735
[45] Date of Patent: May 2, 2000

[54] AMPLIFIER FOR CONTINUOUS HIGH GAIN, NARROWBAND SIGNAL AMPLIFICATION

[75] Inventor: Mark Cloutier, Aylmer, Canada

[73] Assignee: Philsar Semiconductor Inc., Canada

[21] Appl. No.: 09/209,051

[22] Filed: Dec. 9, 1998

[30] Foreign Application Priority Data

Dec. 9, 1997 [CA] Canada ................................. 2224261

[51] Int. Cl.[7] ............................................. H03G 3/10
[52] U.S. Cl. ................................... 330/279; 330/107
[58] Field of Search ................................. 330/107, 109, 330/129, 279; 455/126

[56] References Cited

U.S. PATENT DOCUMENTS

| | | | |
|---|---|---|---|
| 3,588,725 | 6/1971 | Geffe | 330/107 |
| 4,204,176 | 5/1980 | Takasaki et al. | 330/109 |
| 4,393,514 | 7/1983 | Minakuchi et al. | 455/336 |
| 5,321,852 | 6/1994 | Seong | 455/182.1 |
| 5,416,441 | 5/1995 | Nagano | 330/129 |
| 5,896,064 | 4/1999 | Kaku | 330/279 |

FOREIGN PATENT DOCUMENTS

0704982A2  4/1996  European Pat. Off. .......... H04B 1/10

05075348  3/1993  Japan .................................. H03D 3/02

OTHER PUBLICATIONS

Selectivity an Sensitivity Performances of Superregenerative Receivers; Swiss Federal Institute of Technology Lausanne, Electronics Laboratories; 4 pgs.

FA 8.4: A 2V, 600A, 1GHz, BiCMOS Super–Regenerative Receiver from the IEEE; Patrick Favre, et al.; 1998; pp. 8.4–1–through 8.4–10.

Electronics Designers Handbook, Second Edition; Robert W. Landee, et al.; 1977; pp. 23–3 and 24–4.

*Primary Examiner*—Robert Pascal
*Assistant Examiner*—Henry Choe
*Attorney, Agent, or Firm*—Thomas, Kayden, Horstemeyer & Risley, LLP

[57] ABSTRACT

An apparatus and method to obtain a high Q, narrowband active filter with high gain suitable for an integrated circuit implementation. The high Q is achieved via active feedback with an amplitude control loop. The frequency control of the active filter is achieved by means of a frequency locked loop. Both control loops compare the thermal noise of the active filter itself to voltage and frequency references to achieve the stable operating point. Control loops are normally slow relative to the transmitted data, hence avoiding the data altering the operating point of the filter.

19 Claims, 6 Drawing Sheets

AMPLIFIER FOR CONTINUOUS HIGH GAIN, NARROWBAND SIGNAL AMPLIFICATION

The present invention relates generally to active filters and more specifically to high gain, narrowband amplifiers.

BACKGROUND OF THE INVENTION

Communications systems transmit or receive signals in a portion of the radio frequency spectrum known as a frequency band. Usually, communications systems are forced to operate in close proximity to other bands. From the point of view of the communications system, all other signals can be regarded as interfering signals. Hence, communications systems attempt to use the band of interest while excluding interference from all other bands.

Therefore, most communications systems usually use some form of filter to allow the use of the information in the desired frequency band while excluding all other interference. These filters are often called bandpass filters or band limiting filters, and they may be used in receivers, transmitters, or both. Indeed, band limiting filters may be useful in any electronic system which requires frequency selectivity.

There are a number of desirable characteristics for band limiting filters. Firstly, it is often desirable for band limiting filters to be narrowband, that is, they are required to minimize the undesired information outside the band of interest that is passed by the filter. Sometimes it is also desirable for band limiting filters to provide gain thereby increasing the signal level, since often the communications system either transmits from a low power signal source or receives a low power signal.

One known implementation of band limiting filters uses all passive components. Filters of this implementation are often known as passive filters. In general, passive filters are known to be implemented with combinations of lumped elements such as inductors and capacitors, or with equivalent distributed resonant structures such as ceramics, crystals, resonant transmission lines, and the like, or with hybrid lumped element structures with partially resonant structures, such as shortened transmission lines with capacitors or inductors added.

A limitation of the passive approach is that passive filters do not provide gain because there is no active element. Furthermore, passive elements will have manufacturing tolerances which, at radio frequencies, can be substantial enough to degrade the frequency performance of the filter. This degradation in frequency performance could result in a filter that is not narrowband enough or may be at the wrong frequency. Additionally, passive structures on a semiconductor substrate in an integrated circuit can be relatively large which may directly affect the cost of the system.

To achieve a signal gain as well as a narrowband response, an active filter is desirable. An active filter contains at least one active element, such as a transistor or diode, to provide a gain. Active filters may be realized as amplifiers where the frequency selectivity is achieved by the quality of the input and output impedance matching. Therefore, the amplifier may provide gain to a narrowband of the frequency spectrum while attenuating other out of band interferers.

A known type of active filter is called a super regenerative receiver. This device alternates itself from completely turned off, through an amplifying state, into an oscillating state. As the device passes through the amplifying state and close to the oscillating state, the amplifying bandwidth narrows Thus, there is a period of time, after startup, but before the gain of the device saturates and oscillation begins, where the device is capable of narrowband amplification. This operating period, or state, is desirable for band limiting filter operation.

Traditionally, there have been a number of limitations to the super regenerative receiver approach. Firstly, it has been difficult to control the operation of the device during the desirable amplification stage. Specifically, the devices have not been sufficiently controlled so that the desirable amplifier state is maintained close to oscillation. Thus, the devices were usually pulsed on and off. This pulsed mode of operation limits the selectivity of the device due to sampling alias responses, and thus makes the device vulnerable to interference. Secondly, although in the amplifying state the devices can achieve very high sensitivity, they are difficult to tune and are highly non-linear, As a result of these factors, super regenerative receivers have seen limited usefulness in general high performance communications applications.

For the foregoing reasons, there is a need to provide an amplifier for high gain, narrowband signal amplification.

SUMMARY OF THE INVENTION

The present invention is directed to an amplifier for continuous high gain, narrowband signal amplification.

An embodiment of the present invention is an amplifier for continuous high gain, narrowband signal amplification. The amplifier includes a first summer, an active circuit, a feedback circuit, a first controller for adjusting the gain of the active circuit and a second controller for adjusting the phase of the feedback circuit. The first summer responds to an input signal and a feedback signal. The first summer produces an active circuit input signal. The active circuit responds to the active circuit input signal and a gain control signal. The active circuit produces an output signal. The feedback circuit responds to the output signal and a phase control signal. The feedback circuit produces a feedback signal. The first controller responds to the output signal. The first controller produces the gain control signal. The second controller responds to the output signal. The second controller produces the phase control signal.

Another embodiment of the present invention is an amplification method for continuous high gain, narrowband signal amplification. The amplification method includes the steps of adjusting the gain of an active circuit, adjusting the phase of a feedback circuit. The adjustments obtain high gain, narrowband amplification of an input signal.

An advantage of the present invention is high gain, narrowband amplification of the input signal.

According to the present invention, there is provided an amplifier for continuous high gain, narrowband signal amplification, the amplifier comprising: (a) a first summer, the first summer responding to an input signal and a feedback signal and the first summer producing an active circuit input signal; (b) an active circuit, the active circuit responding to the active circuit input signal and a gain control signal and the active circuit producing an output signal; (c) a feedback circuit, the feedback circuit responding to the output signal and a phase control signal and the feedback circuit producing a feedback signal; (d) a first controller for adjusting the gain of the active circuit, the first controller responding to the output signal and the first controller producing the gain control signal; and (e) a second controller for adjusting the phase of the feedback circuit, the second controller responding to the output signal and the second controller producing the phase control signal.

According to the present invention, there is further provided an amplification method for continuous high gain, narrowband signal amplification, the amplification method comprising the steps of: (a) adjusting the gain of an active circuit; (b) adjusting the phase of a feedback circuit; and (c) wherein the adjustments obtain high gain, narrowband amplification of an input signal.

Other advantages, objects and features of the present invention will be readily apparent to those skilled in the art from a review of the following detailed description of preferred embodiments in conjunction with the accompanying drawings and claims.

BRIEF DESCRIPTION OF THE DRAWINGS

These and other features of the invention will become more apparent from the following description in which reference is made to the appended drawings in which.

DETAILED DESCRIPTION OF THE EMBODIMENTS

By way of overview, the present invention is an apparatus and method to obtain a high quality factor or Q, narrowband active filter with high gain suitable for an integrated circuit implementation. The high Q is achieved using active feedback with an amplitude control loop. The frequency control of the active filter is achieved using a phase locked loop 52 or a frequency locked loop. Both control loops compare the thermal noise of the active filter to voltage and frequency references thereby achieving a stable operating point. The control loops are normally slow relative to the transmitted data, hence the data does not tend to alter the operating point of the filter.

Firstly, the structure of the embodiments of the present invention is described, followed by a description of the method of operation. Finally, advantages of the various embodiments of the present invention are described.

Figure 1:
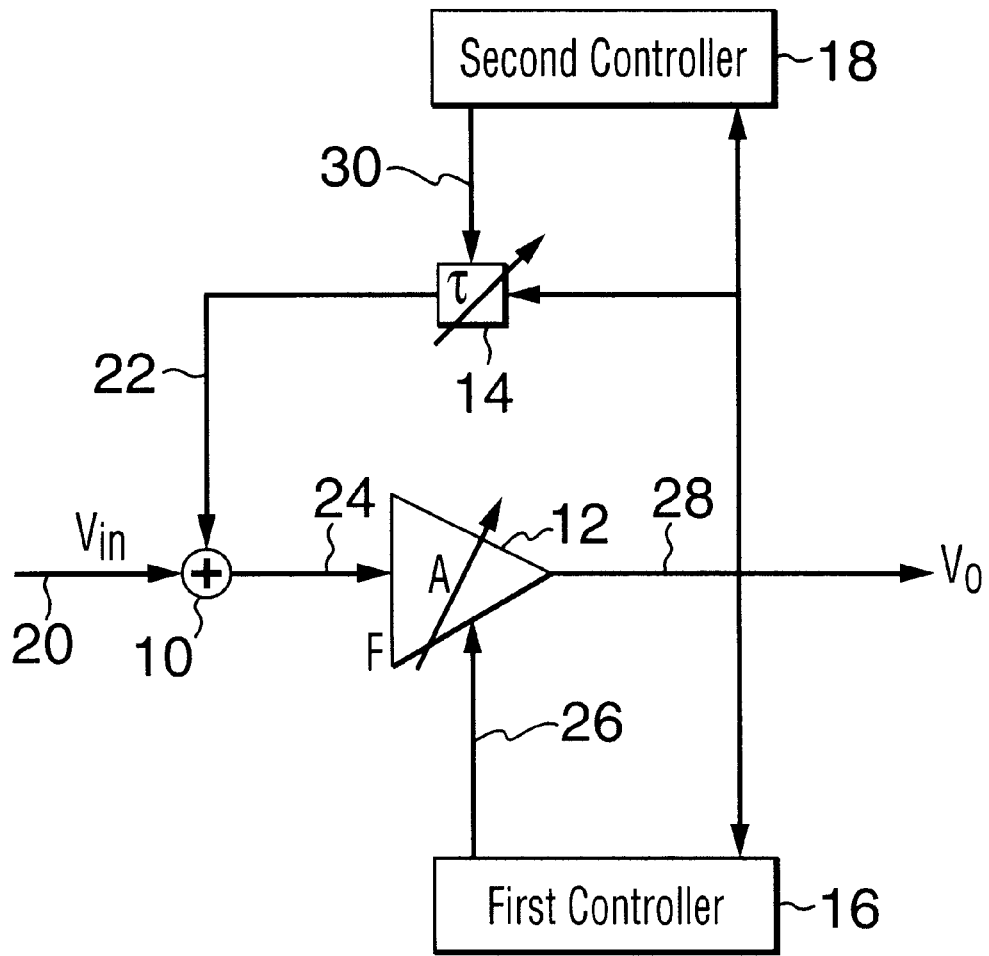
FIG. 1 illustrates a block diagram of an embodiment of the present invention.

FIG. 1 illustrates an embodiment of the present invention. The apparatus is an amplifier for continuous high gain, narrowband signal amplification. The amplifier includes a first summer 10, an active circuit 12, a feedback circuit 14, a first controller 16 for adjusting the gain of the active circuit 12 and a second controller 18 for adjusting the phase of the feedback circuit 14. Each of these elements are described as follows.

The first summer 10 responds to an input signal 20 and a feedback signal 22. The first summer 10 produces an active circuit input signal 24. The active circuit 12, such as a transistor, diode or other like a variable gain amplifier, responds to the active circuit input signal 24 and a gain control signal 26. The active circuit 12 produces an output signal 28. The feedback circuit 14 responds to the output signal 28 and a phase control signal 30. The feedback circuit 14 produces the feedback signal 22. The first controller 16 responds to the output signal 28. The first controller 16 produces the gain control signal 26. The second controller 18 responds to the output signal 28. The second controller 18 producing the phase control signal 30.

Figure 2:
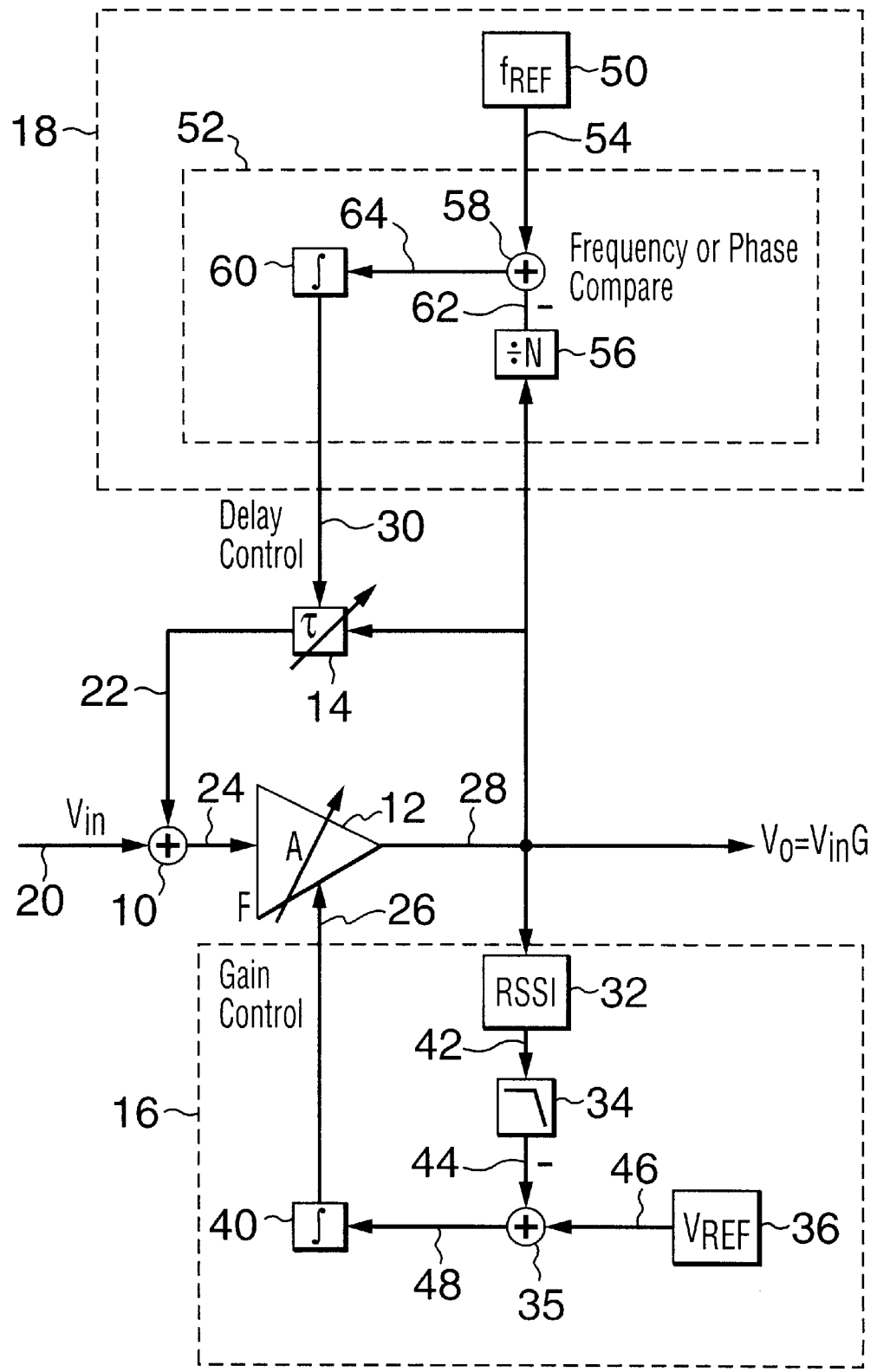
FIG. 2 illustrates a block diagram of another embodiment of the present invention.

In another embodiment of the present invention, illustrated in FIG. 2, the first and second controllers 16 and 18 further include the following elements.

The first controller 16 includes a received signal strength indicator 32, a bandwidth limit filter 34, a reference voltage source 36, a second summer 38 and a first loop filter 40. The elements are further described as follows.

The received signal strength indicator 32 responds to the output signal 28. The received signal strength indicator 32 produces a RSSI output signal 42. The bandwidth limit filter 34 responds to the RSSI output signal 42. The bandwidth limit filter 34 produces a bandwidth limited signal 44. The reference voltage source 36 produces a reference voltage signal 46. The second summer 38 responds to the bandwidth limited signal 44 and the reference voltage signal 46. The second summer 38 produces an amplitude error signal 48. The amplitude error signal 48 is proportional to the amplitude difference between the voltage reference signal and the bandwidth limited signal 44. The first loop filter 40, such as an integrator, responds to the amplitude error signal 48. The first loop filter 40 produces the gain control signal 26.

The second controller 18 includes a reference frequency source 50 and a phase locked loop 52. Alternatively, a frequency locked loop may be used instead of a phase locked loop. The reference frequency source 50, such as a crystal oscillator, produces a reference frequency signal 54. If the phase locked loop 52 is used, the phase locked loop 52 responds to the reference frequency signal 54 and the phase locked loop 52 produces the phase control signal 30. Similarly, if a frequency locked loop is used the frequency locked loop responds to the reference frequency signal 54 and the frequency locked loop produces the phase control signal 30.

If the phase locked loop 52 is used, the phased locked loop includes a frequency divider 56, a phase comparator 58 and a second loop filter 60. The frequency divider 56 responds to the output signal 28. The frequency divider 56 produces a divided frequency signal 62. The phase comparator 58 responds to the reference frequency signal 54 and the divided frequency signal 62. The phase comparator 58 produces a compared signal 64. The compared signal 64 is proportional to the frequency difference between the reference frequency signal 54 and the divided frequency signal 62. The second loop filter 60, such as an integrator, responds to the compared signal 64. The second loop filter 60 produces the phase control signal 30.

If a frequency locked loop is used, the frequency lock loop includes a frequency divider 56, a frequency comparator and a second loop filter 60. The frequency divider 56 responds to the output signal 28. The frequency divider 56 produces a divided frequency signal 62. The frequency comparator responds to the reference frequency signal 54 and the divided frequency signal 62. The frequency comparator produces a compared signal 64. The compared signal 64 is proportional to the frequency difference between the reference frequency signal 54 and the divided frequency signal 62. The second loop filter 60, such as an integrator, responds to the compared signal 64. The second loop filter 60 produces the phase control signal 30.

Figure 3:
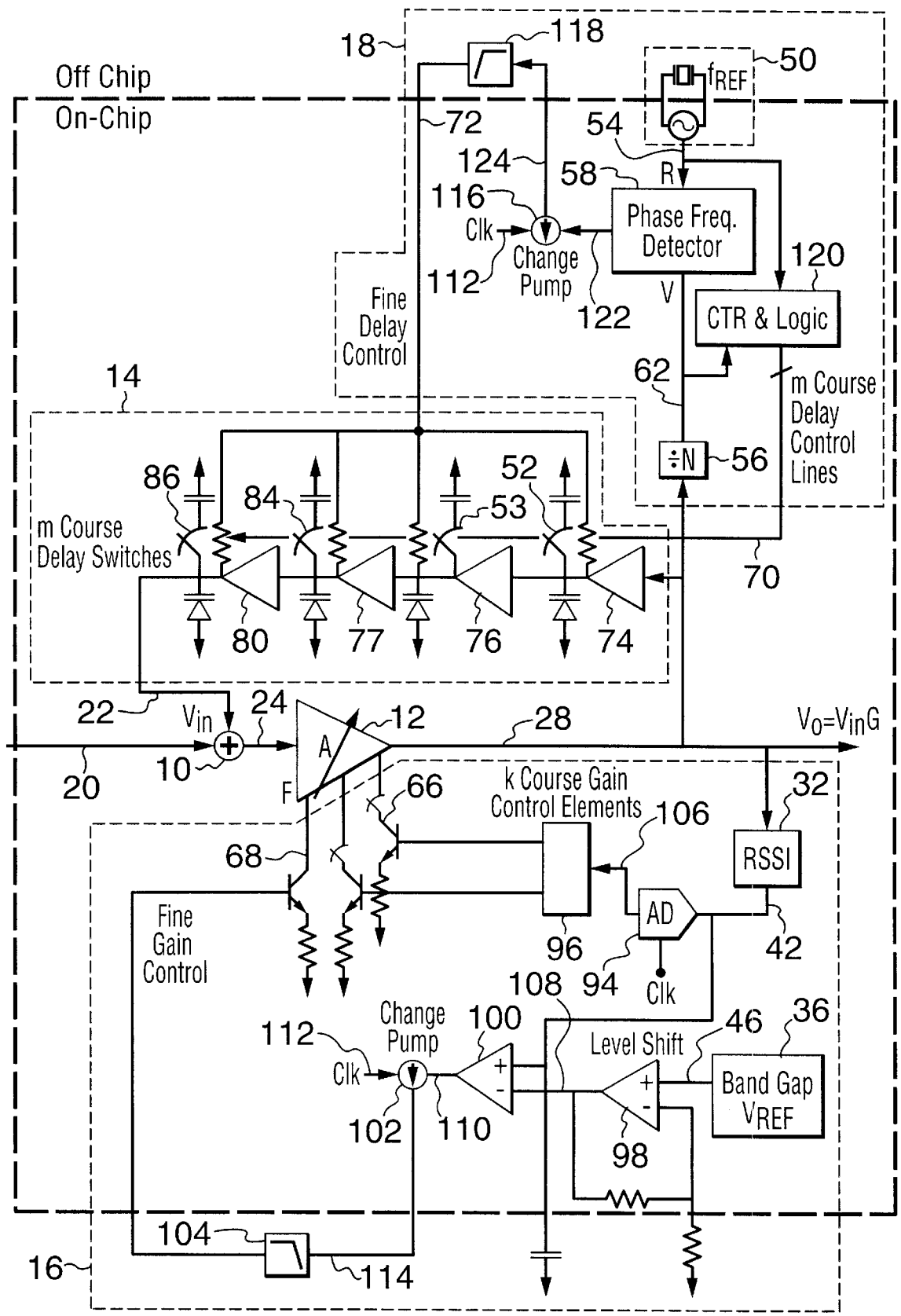
FIG. 3 illustrates a block diagram of another embodiment of the present invention.

FIG. 3 illustrated yet another embodiment of the present invention. The amplifier includes a first summer 10, a variable gain amplifier, a feedback circuit 14, a first controller 16 for adjusting the gain of the variable gain amplifier and a second controller 18 for adjusting the phase of the feedback circuit 14.

The first summer 10 responds to an input signal 20 and a feedback signal 22. The first summer 10 produces an active circuit input signal 24. The variable gain amplifier responds to the active circuit input signal 24, a course gain control signal 66 and a fine gain control signal 68. The variable gain amplifier produces an output signal 28.

The feedback circuit 14 responds to the output signal 28, a course phase control signal 70 and a fine phase control signal 72. The feedback circuit 14 produces the feedback signal 22. The feedback circuit 14 further includes a first amplifier 74, a second amplifier 76, a third amplifier 78, a fourth amplifier 80, a first course delay switch 82, a second course delay switch 83, and a third course delay switch 84 and a fourth course delay switch 86.

The first amplifier 74 responds to the output signal 28 and the fine phase control signal 72. The first amplifier 74 produces a second amplifier 76 input signal. The second amplifier 76 responds to the second amplifier input signal 88 the fine phase control signal 72. The second amplifier 76 produces a third amplifier input signal 90. The third amplifier 78 responds to the third amplifier input signal 90 and the fine phase control signal 72. The third amplifier 78 produces a fourth amplifier input signal 92. The fourth amplifier 80 responds to the fourth amplifier input signal 92 the fine phase control signal 72. The fourth amplifier 80 produces the feedback signal 22. The first course delay switch 82 responds to a course phase control signal 70. The first course delay switch 82 controls the first amplifier 74. The second course delay switch 83 responds to a course phase control signal 70. The second course delay switch 83 controls the second amplifier 76. The third course delay switch 84 responds to a course phase control signal 70. The third course delay switch 84 controls the third amplifier 78. The fourth course delay switch 86 responds to the course phase control signal 70. The fourth course delay switch 86 controls the fourth amplifier 80.

The first controller 16 responds to the output signal 28. The first controller 16 produces the course gain control signal 66 and the fine gain control signal 68. The first controller 16 further includes a receive signal strength indicator 32, an analog to digital converter 94, a course gain control element 96, a band gap reference voltage source 36, a level shifter 98, a fifth operational amplifier 100, a first charge pump 102 and a second bandwidth limiting filter 104.

The receive signal strength indicator 32 responds to the output signal 28. The receive signal strength indicator 32 produces a RSSI output signal 42. The analog to digital converter 94 responds to the RSSI output signal 42. The analog to digital converter 94 produces a digital RSSI output signal 106. The course gain control element 96 responds to the digital RSSI output signal 106. The course gain control produces the course gain control signal 66. The band gap reference voltage source 36 produces a reference voltage signal 46. The level shifter 98 responds to the reference voltage signal 46. The level shifter 98 produces a level sifted voltage signal 108. The fifth operational amplifier 100 responds to the level shifter signal and the RSSI output signal 42. The fifth operational amplifier 100 produces a first charge pump input signal 110. The first charge pump 102 responds to the first charge pump input signal 110 and a clock signal 112. The first charge pump 102 produces a first charge pump output signal 114. The second bandwidth limiting filter 104 responds to the first charge pump output signal 114. The second bandwidth limiting filter 104 produces the fine gain control signal 68.

The second controller 18 responds to the output signal 28. The second controller 18 produces the fine phase control signal 72 and the course phase control signal 70. The second controller 18 includes a crystal reference oscillator 50, a frequency divider 56, a phase frequency detector 58, a second charge pump 116, a filter 118 and a counter with logic 120.

The crystal reference oscillator 50 produces the reference frequency signal 54. The frequency divider 56 responds to the output signal 28. The frequency divider 56 produces a divided frequency signal 62. The phase frequency detector responds to the reference frequency signal 54 and the divided frequency signal 62. The phase frequency detector produces a second charge pump input signal 122. The second charge pump 116 responds to the second charge pump input signal 122 and the clock signal 112. The second charge pump 116 produces a second charge pump output signal 124. The filter responds to the second charge pump output signal 124. The filter produces the fine phase control signal 72. The counter with logic responds to the divided frequency signal 62 and the reference frequency signal 54. The counter with logic produces the course phase control signal 70.

Figure 4:
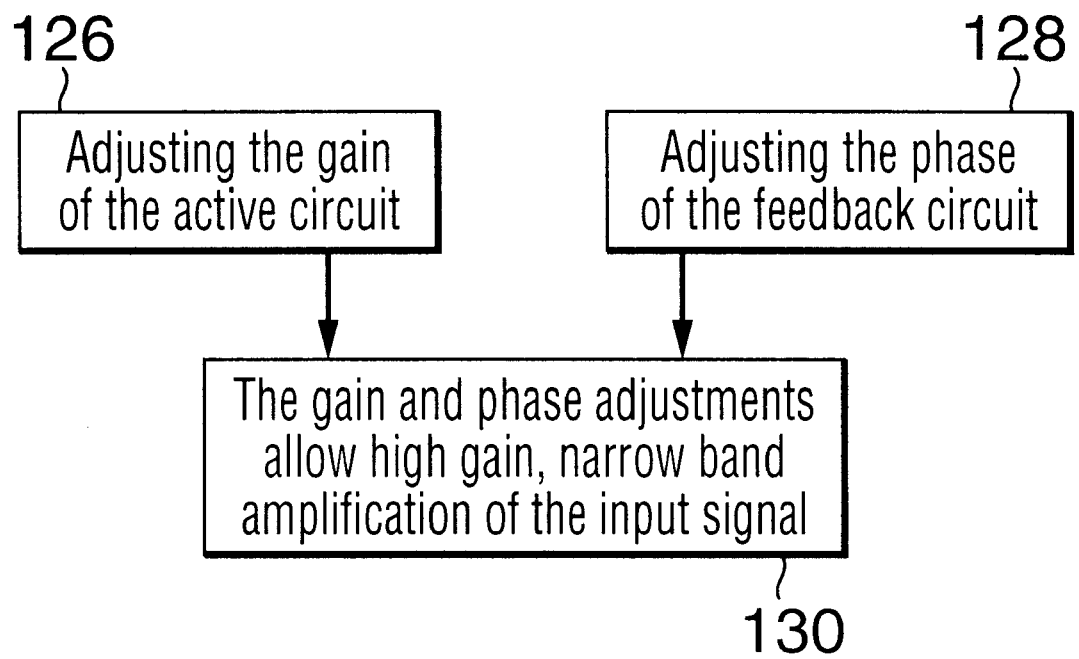
FIG. 4 illustrates a flowchart of another embodiment of the present invention.

The method of operation is now described. FIG. 4 illustrates an amplification method for continuous high gain, narrowband signal amplification, the amplification method comprising the steps of adjusting the gain 126 of the active circuit 12 and the phase 128 of the feedback circuit 14 herein the gain and phase adjustments 130 allow high gain, narrowband amplification of the input signal 24

Figure 5:
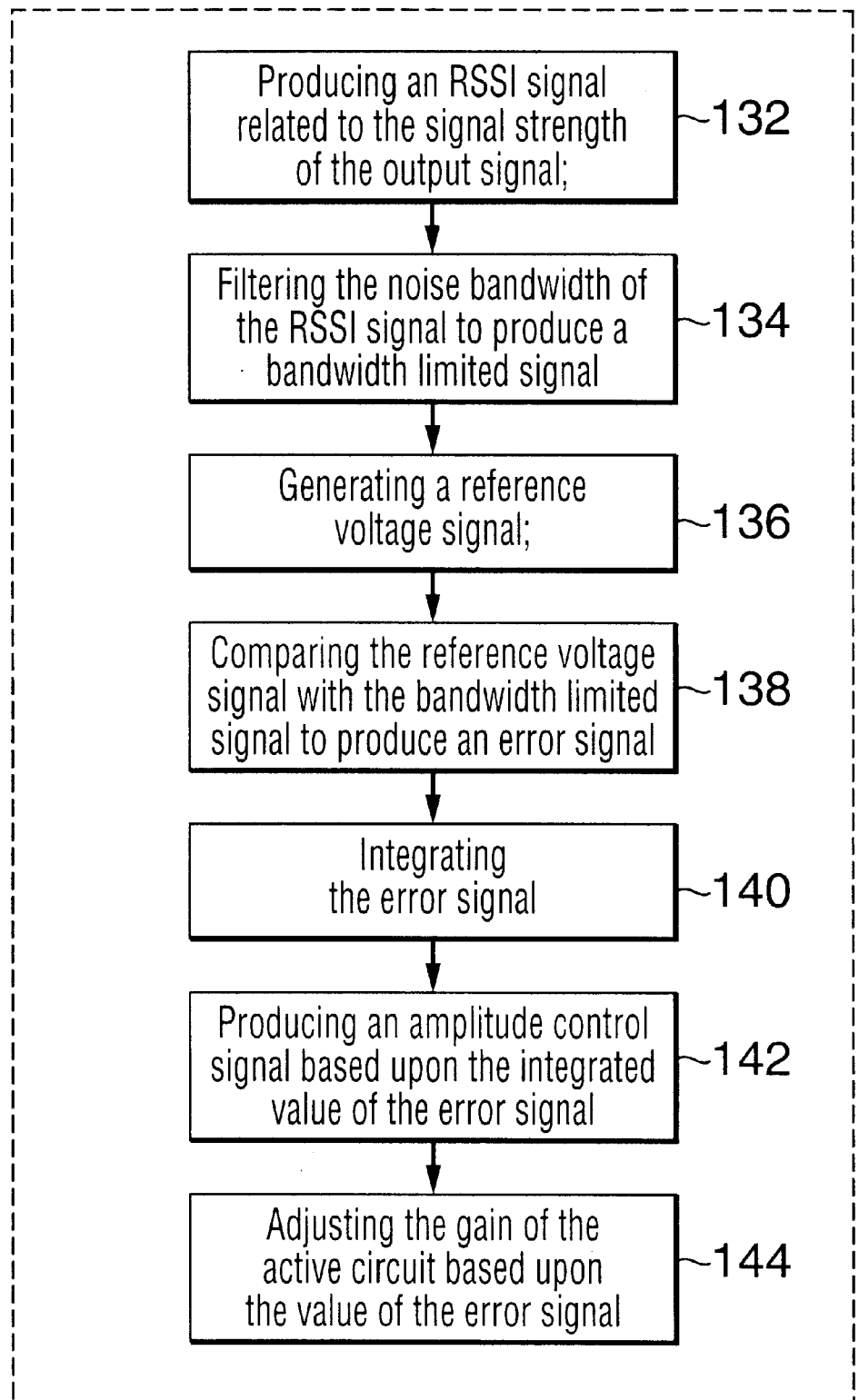
FIG. 5 illustrates a flowchart of another embodiment of the present invention.

FIG. 5 illustrates the gain adjusting step 126 which includes the following steps:

Step 132, producing an RSSI signal related to the signal strength of the output signal 28;

Step 134, filtering the noise bandwidth of the RSSI signal to produce a bandwidth limited signal 44;

Step 136, generating a reference voltage signal 46;

Step 138, comparing the reference voltage signal 46 with the bandwidth limited signal 44 to produce an error signal, Step 140, integrating the error signal;

Step 142, producing an amplitude control signal based upon the integrated value of the error signal; and Step 144, adjusting the gain of the active circuit 12 based upon the value of the control signal.

Figure 6:
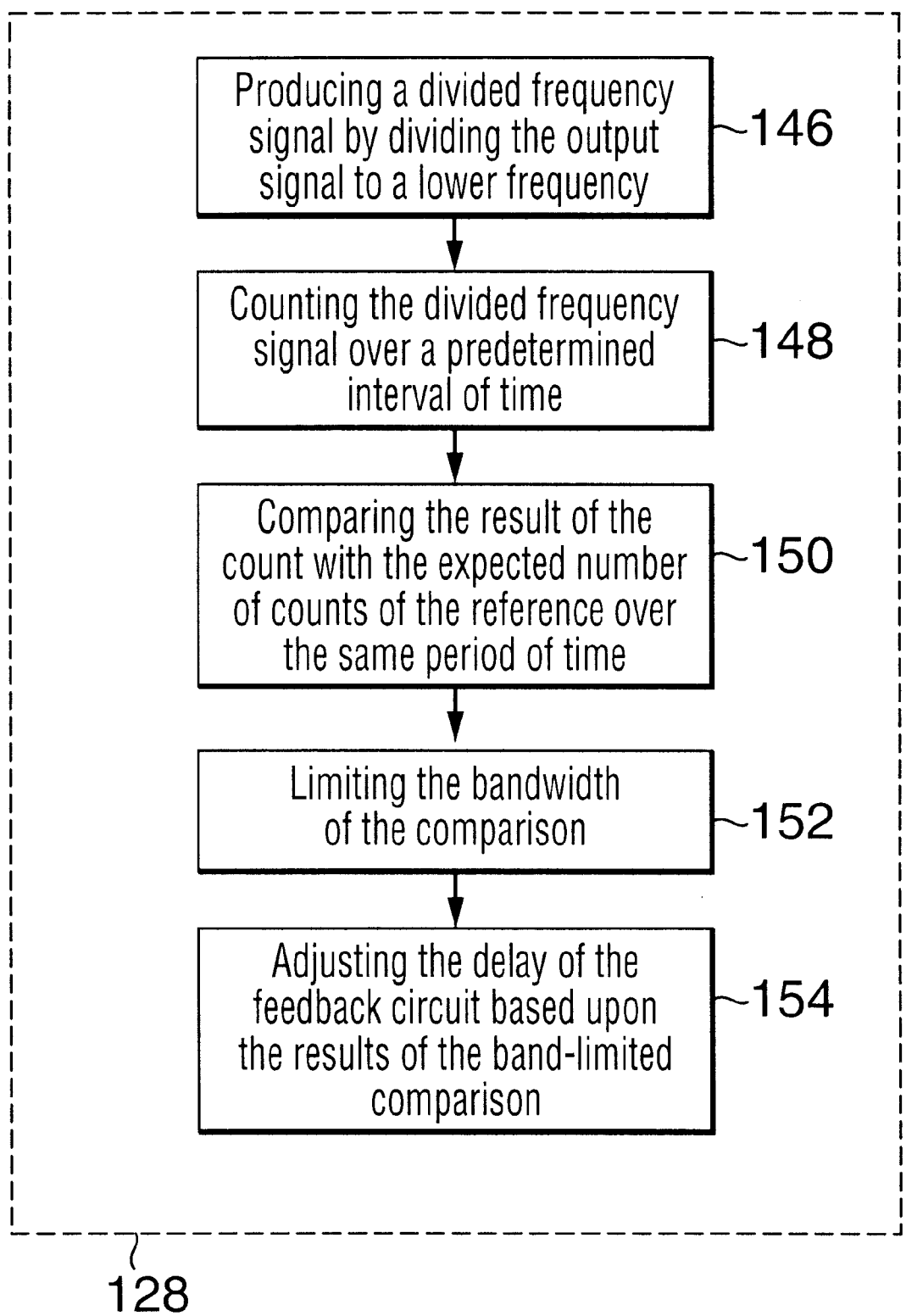
FIG. 6 illustrates a flowchart of another embodiment of the present invention.

FIG. 6 illustrates the phase adjusting step 128 which includes the following steps Step 146, producing a divided frequency signal 62 by dividing the output signal 28 to a lower frequency;

Step 148, counting the divided frequency signal 62 over a predetermined interval of time;

Step 150, comparing the result of the count with the expected number of counts of the reference over the same period of time;

Step 152, limiting the bandwidth of the comparison; and

Step 154, adjusting the delay of the feedback circuit 14 based upon the results of the band-limited comparison.

Finally, advantages of the various embodiments of the invention are now described. A description of a number of alternative implementations are also included. Firstly, the control loops use the thermal noise in the amplifier to maintain the amplifier in a high gain, narrowband amplification state. There is a feedback loop in the amplifier, hence the thermal noise power grows from startup in a manner analogous to the growth of the thermal noise power in an oscillator. The present invention however, has the advantage that the control loops use the thermal noise to maintain the amplifier in a state close to, but not equal to, oscillation. The result is high gain, narrowband amplification.

Furthermore the variable gain amplifier, may have both fine gain adjust and a crude or discrete gain adjust. The fine gain adjust is such that it has a very limited gain adjust over a large control voltage. This is useful to allow the amplifier to reach the tight levels of gain controls. The discrete gain adjust is used to place the amplifier at a gain within the control range of the fine gain adjust. The discrete gain adjusts are noise immune as they are of a switched nature and do not rely on a low noise analog control. The need for the discrete gain adjust and the number of discrete levels required depends upon the precision and the Q levels to be achieved and on the precision of the integrated circuit processes being used.

The filter to limit the bandwidth of the receive signal strength indicator (RSSI) output may limit noise and upper order signal harmonics generated by the RSSI.

Optionally, an advantage is to measure the output of the amplifier in discrete steps using the analog to digital converter 94 therefore allowing the gain to be adjusted in discrete steps to within the fine adjust range where the integrator takes over.

The frequency of the signal being generated or filtered is controlled by the delay in the feedback circuit 14. It is difficult In an integrated circuit to accurately achieve this delay without some form of feedback. The preferred embodiment of this invention is to limit the range of delays using some physical means, which limits the range of possible amplification frequencies. The practical limits should take into account the tolerances achievable on a given integrated circuit process.

Depending upon the application, the fine frequency adjust used in the invention may be achieved in a number of different forms. If a low phase noise signal source is desired then a crystal oscillator reference should be used with a phase locked loop 52 (PLL). This type of circuitry is readily achievable in integrated circuit form with only the crystal itself and portions of the PLL low pass loop filter required external to the integrated circuit. In the simplest form the reference may be chosen as a fixed integer sub-multiple of the desired output frequency. In a more advanced variation of the invention the reference may be operated in a variable PLL which can achieve many sub-multiple division ratios, including rational numbers such as might be achieved with a fractional-N synthesizer based PLL for example.

If the in-close phase noise of the amplifier is not a requirement for the application, as may be the case say for some less demanding applications, then the frequency control loop may be simplified to a simple frequency locked loop (FLL) This type of loop counts the output frequency over a long period of time, and compares the result with a similar count of the reference frequency over the same period of time. The comparison is used in its simplest form to decide to adjust the delay of the feedback circuit 14 up or down, to achieve the correct output frequency. The tolerance of the output frequency will be approximately the accuracy of the crystal in parts-per-million, or the reciprocal of the count interval, which ever is greater. Typically a low noise fine frequency control loop can be built with a charge pump on an integrated circuit which pumps up or down to adjust the frequency. The optional fine phase adjust can be achieved in a number of ways. One method is to use a voltage variable capacitance, such as a bipolar transistor junction in back bias, as the delay adjust element.

Similar to the amplitude control loop the delay can be implemented with fine and crude adjustments, with the crude steps adjusted by discrete means and the fine adjust controlled by means of a large voltage to control a fine delay adjust. This is the most noise immune approach. Again requirement for the crude adjust, and the number of levels of crude adjust will be determined by the precision of the application and the tolerances of the integrated circuit process used.

All of the above adjusts may need to be done in crude discrete steps and in fine vernier steps depending upon the application. This does not change the generality of the invention.

The feedback filter may also be realized as any form of bandpass filter such as an LC filter. Furthermore, the amplifier may be redrawn as a tuned amplifier. Moreover, throughout the description altering the delay of the feedback circuit 14 is functionally equivalent to altering the phase of the feedback circuit 14.

Numerous modifications, variations and adaptations may be made to the particular embodiments of the invention described above without departing from the scope of the invention, which is defined in the claims.

What is claimed is:

1. An amplifier for continuous high gain, narrowband signal amplification, the amplifier comprising:
   (a) a first summer, the first summer responding to an input signal and a feedback signal and the first summer producing an active circuit input signal;
   (b) an active circuit, the active circuit responding to the active circuit input signal and a gain control signal and the active circuit producing an output signal;
   (c) a feedback circuit, the feedback circuit responding to the output signal and a phase control signal and the feedback circuit producing a feedback signal;
   (d) a first controller for adjusting the gain of the active circuit, the first controller responding to the output signal and the first controller producing the gain control signal; and
   (e) a second controller for adjusting the phase of the feedback circuit, the second controller responding to the output signal and the second controller producing the phase control signal.

2. An amplifier as recited in claim 1, wherein the active circuit is a variable gain amplifier.

3. An amplifier as recited in claim 1, wherein the first controller comprises:
   (a) a received signal strength indicator, the received signal strength indicator responding to the output signal and the received signal strength indicator producing a RSSI output signal;
   (b) a bandwidth limit filter, the bandwidth limit filter responding to the RSSI output signal and the bandwidth limit filter producing a bandwidth limited signal;
   (c) a reference voltage source, the reference voltage source producing a reference voltage signal;
   (d) a second summer, the second summer responding to the bandwidth limited signal and the reference voltage signal and the second summer producing an amplitude error signal, the amplitude error signal being proportional to the amplitude difference between the voltage reference signal and the bandwidth limited signal; and (e) a first loop filter, the first loop filter responding to the amplitude error signal and the first loop filter producing the gain control signal.

4. An amplifier as recited in claim 3, wherein the first loop filter is an integrator.

5. An amplifier as recited in claim 1, wherein the second controller comprises:
   (a) a reference frequency source producing a reference frequency signal; and
   (b) a phase locked loop, the phase locked loop responding to the reference frequency signal and the phase locked loop producing the phase control signal.

6. An amplifier as recited in claim 5, wherein the reference frequency course is a crystal oscillator.

7. An amplifier as recited in claim 5, wherein the phase locked loop comprises:
   (a) a frequency divider, the frequency divider responding to the output signal and the frequency divider producing a divided frequency signal;
   (b) a phase comparator, the phase comparator responding to the reference frequency signal and the divided frequency signal and the phase comparator producing a compared signal, the compared signal being proportional to the frequency difference between the reference frequency signal and the divided frequency signal; and
   (c) a second loop filter, the second loop filter responding to the compared signal and the second loop filter producing the phase control signal.

8. An amplifier as recited in claim 7, wherein the second loop filter is an integrator.

9. An amplifier as recited in claim 1, wherein the second controller comprises:
   (a) a reference frequency source producing a reference frequency reference signal; and
   (b) a frequency locked loop, the frequency locked loop responding to the reference frequency signal and the frequency locked loop producing the phase control signal.

10. An amplifier as recited in claim 9, wherein the reference frequency source is a crystal oscillator.

11. An amplifier as recited in claim 9, wherein the frequency lock loop comprises:
    (a) a frequency divider, the frequency divider responding to the output signal and the frequency divider producing a divided frequency signal;
    (b) a frequency comparator, the frequency comparator responding to the reference frequency signal and the divided frequency signal and the frequency comparator producing a compared signal, the compared signal being proportional to the frequency difference between the reference frequency signal and the divided frequency signal; and
    (c) a second loop filter, the second loop filter responding to the compared signal and the second loop filter producing the phase control signal.

12. An amplifier as recited in claim 11, wherein the second loop filter is an integrator.

13. An amplifier for continuous high gain, narrowband signal amplification, the amplifier comprising:
    (a) a first summer, the first summer responding to an input signal and a feedback signal and the first summer producing an active circuit input signal;
    (b) an active circuit, the active circuit responding to the active circuit input signal and a gain control signal and the active circuit producing an output signal;
    (c) a feedback circuit, die feedback circuit responding to the output signal and a phase control signal and the feedback circuit producing a feedback signal;
    (d) a first controller for adjusting the gain of the active circuit, the first controller responding to the output signal and the first controller producing the gain control signal, the first controller further comprising:
       i. a received signal strength indicator, the received signal strength indicator responding to the output signal and the received signal strength indicator producing a RSSI output signal;
       ii. a bandwidth limit filter, the bandwidth limit filter responding to the RSSI output signal and the bandwidth limit filter producing a bandwidth limited signal;
       iii. a reference voltage source, the reference voltage source producing a reference voltage signal;
       iv. a second summer, the second summer responding to the bandwidth limited signal and the reference voltage signal and the second summer producing an amplitude error signal, the amplitude error signal being proportional to the amplitude difference between the voltage reference signal and the bandwidth limited signal; and
       v. a first loop filter, the first loop filter responding to the amplitude error signal and the first loop filter producing the gain control signal;
    (e) a second controller for adjusting the phase of the feedback circuit, the second controller responding to the output signal and the second controller producing the phase control signal, the second controller further comprising:
       i. a reference frequency source producing a reference frequency reference signal;
       ii. a frequency divider, the frequency divider responding to the output signal and the frequency divider producing a divided frequency signal;
       iii. a phase comparator, the phase comparator responding to the reference frequency signal and the divided frequency signal and the phase comparator producing a compared signal, the compared signal being proportional to the frequency difference between the reference frequency signal and the divided frequency signal; and
       iv. a second loop filter, the second loop filter responding to the compared signal and the second loop filter producing the phase control signal.

14. An amplifier as recited in claim 13, wherein the first and second loop filters are integrators.

15. An amplifier for continuous high gain, narrowband signal amplification, the amplifier comprising:
    (a) a first summer, the first summer responding to an input signal and a feedback signal and the first summer producing an active circuit input signal;
    (b) a variable gain amplifier, the variable gain amplifier responding to the active circuit input signal, a course gain control signal and a fine gain control signal and the variable gain amplifier producing an output signal;
    (c) a feedback circuit, the feedback circuit responding to the output signal, a course phase control signal and a fine phase control signal and the feedback circuit producing a feedback signal, the feedback circuit further comprising:
       i. a first amplifier, the first amplifier responding to the output signal and the fine phase control signal and the first amplifier producing a second amplifier input signal;

ii. a second amplifier, the second amplifier responding to the second amplifier input signal the fine phase control signal and the second amplifier producing a third amplifier input signal;

iii. a third amplifier, the third amplifier responding to the third amplifier input signal and a fine phase control signal the third amplifier producing a fourth amplifier input signal;

iv. a fourth amplifier, the fourth amplifier responding to the fourth amplifier input signal and the fine phase control signal the fourth amplifier producing the feedback signal;

v. a first course delay switch, the first course delay switch responding to the course phase control signal and the first course delay switch controlling the first amplifier;

vi. a second course delay switch; the second course delay switch responding to the course phase control signal and the second course delay switch controlling the second amplifier; and vii. a third course delay switch, the third course delay switch responding to the course phase control signal and the third course delay switch controlling the third amplifier; and viii. a fourth course delay switch, the forth course delay switch responding to the course phase control signal and the fourth course delay switch controlling the fourth amplifier;

(d) a first controller for adjusting the gain of the active circuit, the first controller responding to the output signal and the first controller producing the course gain control signal and the fine gain control signal, the first controller further comprising:

i. a receive signal strength indicator, the receive signal strength indicator responding to the output signal and the receive signal strength indicator producing a RSSI output signal;

ii. an analog to digital converter, the analog to digital converter responding to the RSSI output signal and the analog to digital converter producing a digital RSSI output signal;

iii. a course gain control element, the course gain control element responding to the digital RSSI output signal and the course gain control producing the course gain control signal;

iv. a band gap reference voltage source, the band gap reference voltage source producing a reference voltage signal;

v. a level shifter, the level shifter responding to the reference voltage signal and the level shifter producing a level shifter voltage signal;

vi. a fifth operational amplifier, the fifth operational amplifier responding to the level shifter signal and the RSSI output signal and the fifth operational amplifier producing a first charge pump input signal;

vii. a first charge pump, the first charge pump responding to the first charge pump input signal and a clock signal and the first charge pump producing a first charge pump output signal; and viii. a bandwidth limiting filter, the bandwidth limiting filter responding to the first charge pump output signal and the bandwidth limiting filter producing the fine gain control signal;

(e) a second controller for adjusting the phase of the feedback circuit, the second controller responding to the output signal and the second controller producing the phase control signal, the second controller further comprising:

i. a crystal reference oscillator, the crystal reference oscillator producing the reference frequency signal;

ii. a frequency divider, the frequency divider responding to the output signal and the frequency divider producing a divided frequency signal;

iii. a phase frequency detector, the phase frequency detector responding to the reference frequency signal and the divided frequency signal and the phase frequency detector producing a second charge pump input signal;

iv. a second charge pump, the second charge pump responding to the second charge pump input signal and the clock signal and the second charge pump producing a second charge pump output signal;

v. a filter, the filter responding to the second charge pump output signal and the filter producing the fine phase control signal; and vi. a counter with logic, the counter with logic responding to the divided frequency signal and the reference frequency signal and the counter with logic producing the course phase control signal.

16. An amplification method for continuous high gain, narrowband signal amplification, the amplification method comprising the steps of:

(a) adjusting the gain of an active circuit;

(b) adjusting the phase of a feedback circuit; and (c) wherein the adjustments obtain high gain, narrowband amplification of an input signal.

17. An amplification method as recited in claim 16, wherein the gain adjusting comprises the steps of:

(a) producing an RSSI signal related to the signal strength of the output signal;

(b) filtering the noise bandwidth of the RSSI signal to produce a bandwidth limited signal;

(c) generating a reference voltage signal;

(d) comparing the reference voltage signal with the bandwidth limited signal to produce an error signal;

(e) integrating the error signal;

(f) producing an amplitude control signal based upon the integrated value of the error signal; and (g) adjusting the gain of the active circuit based upon the value of the control signal.

18. An amplification method as recited in claim 16, wherein the phase adjusting comprises the steps of:

(a) producing a divided frequency signal by dividing the output signal to a lower frequency;

(b) counting the divided frequency signal over a predetermined interval of time;

(c) comparing the result of the count with the expected number of counts of the reference over the same period of time;

(d) limiting the bandwidth of the comparison; and (e) adjusting the delay of the feedback circuit based upon the results of the band-limited comparison.

19. An amplification method for continuous high gain, narrowband signal amplification, the amplification method comprising the steps of:

(a) adjusting the gain of an active circuit;

(b) adjusting the phase of a feedback circuit;

(c) wherein the adjustments obtain high gain, narrowband amplification of an input signal;

(d) wherein the gain adjusting comprises the steps of:

i. producing a divided frequency signal by dividing the output signal to a lower frequency;

ii. counting the divided frequency signal over a predetermined interval of time;

iii. comparing the result of the count with the expected number of counts of the reference over the same period of time;

iv. limiting the bandwidth of the comparison; and v. adjusting the delay of the feedback circuit based upon the results of the band-limited comparison;

(e) wherein the phase adjusting comprises the steps of:

i. producing a divided frequency signal by dividing the output signal to a lower frequency;

ii. counting the divided frequency signal over a predetermined interval of time;

iii. comparing the result of the count with the expected number of counts of the reference over the same period of time;

iv. limiting the bandwidth of the comparison; and v. adjusting the delay of the feedback circuit based upon the results of the band-limited comparison.

* * * * *